United States Patent
Kan et al.

(10) Patent No.: US 6,249,468 B1
(45) Date of Patent: Jun. 19, 2001

(54) SEMICONDUCTOR MEMORY DEVICE WITH SWITCHING ELEMENT FOR ISOLATING BIT LINES DURING TESTING

(75) Inventors: Yasuhiro Kan; Noritsugu Isoi; Hiroaki Tamura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/412,504

(22) Filed: Oct. 5, 1999

(30) Foreign Application Priority Data

May 12, 1999 (JP) .................................................. 11-131878

(51) Int. Cl.[7] ...................................................... G11C 7/00
(52) U.S. Cl. .................... 365/201; 365/154; 365/189.05; 365/226; 365/230.06
(58) Field of Search ............................. 365/201, 230.06, 365/189.05, 154, 156, 226

(56) References Cited

U.S. PATENT DOCUMENTS

| | | | |
|---|---|---|---|
| 4,685,086 | * 8/1987 | Tran | 365/203 |
| 5,745,415 | * 4/1998 | Marr | 365/201 |
| 5,784,323 | * 7/1998 | Adams et al. | 365/201 |
| 5,920,517 | * 7/1999 | Wendell | 365/226 |
| 6,067,263 | * 5/2000 | Brady | 365/201 |
| 6,081,464 | * 6/2000 | Marr | 365/201 |
| 6,081,465 | * 6/2000 | Wang et al. | 365/201 |

FOREIGN PATENT DOCUMENTS 2297173    7/1996  (GB) .

* cited by examiner

Primary Examiner—David Nelms
Assistant Examiner—Gene N. Auduong
(74) Attorney, Agent, or Firm—Leydig, Voit & Mayer, Ltd.

(57) ABSTRACT

A semiconductor recording device includes two transistors connected to two bit lines, respectively, that are turned OFF by a retention test signal during a retention test. One of the bit lines is put into high impedance with the help of a write driver, and "0" is output to the other bit line. Therefore, charge at H-level is not supplied to the bit lines during the retention test, so that a memory cell having a faulty connection will not temporarily retain H-level data.

6 Claims, 15 Drawing Sheets

FIG.3

| RT | WE | DI | Bit | $\overline{\text{Bit}}$ |     |
|----|----|----|-----|-----|-----|
| 0  | 0  | 0  | 0   | z   | "L" write test mode |
| 0  | 0  | 1  | z   | 0   | "H" write test mode |
| 0  | 1  | 0  | z   | z   | Read test mode |
| 0  | 1  | 1  | z   | z   | Read test mode |
| 1  | 0  | 0  | 0   | 1   | "L" write normal mode |
| 1  | 0  | 1  | 1   | 0   | "H" write normal mode |
| 1  | 1  | 0  | z   | z   | Read normal mode |
| 1  | 1  | 1  | z   | z   | Read normal mode |

FIG.8

| RT | Decoder | WE | DI | Bit select | $\overline{\text{Bit select}}$ | |
|----|---------|----|----|------------|------------|---|
| 0 | 0 | 0 | 0 | 0 | 0 | Not selected |
| 0 | 0 | 0 | 1 | 0 | 0 | Not selected |
| 0 | 0 | 1 | 0 | 0 | 0 | Not selected |
| 0 | 0 | 1 | 1 | 0 | 0 | Not selected |
| 0 | 1 | 0 | 0 | 1 | 0 | "L" write test mode |
| 0 | 1 | 0 | 1 | 0 | 1 | "H" write test mode |
| 0 | 1 | 1 | 0 | 1 | 1 | Read test mode |
| 0 | 1 | 1 | 1 | 1 | 1 | Read test mode |
| 1 | 0 | 0 | 0 | 0 | 0 | Not selected |
| 1 | 0 | 0 | 1 | 0 | 0 | Not selected |
| 1 | 0 | 1 | 0 | 0 | 0 | Not selected |
| 1 | 0 | 1 | 1 | 0 | 0 | Not selected |
| 1 | 1 | 0 | 0 | 1 | 1 | "L" write normal mode |
| 1 | 1 | 0 | 1 | 1 | 1 | "H" write normal mode |
| 1 | 1 | 1 | 0 | 1 | 1 | Read normal mode |
| 1 | 1 | 1 | 1 | 1 | 1 | Read normal mode |

FIG.11

| RT | WE | Word line | Bit line | D POINT | |
|---|---|---|---|---|---|
| 0 | 0 | 0 | 0 | 0 | Not selected |
| 0 | 0 | 0 | 1 | 0 | Not selected |
| 0 | 0 | 1 | 0 | 1 | "L" write test mode |
| 0 | 0 | 1 | 1 | 0 | "H" write test mode |
| 0 | 1 | 0 | 0 | 0 | Not selected |
| 0 | 1 | 0 | 1 | 0 | Not selected |
| 0 | 1 | 1 | 0 or 1 | 1 | Read test mode |
| 0 | 1 | 1 | 0 or 1 | 1 | Read test mode |
| 1 | 0 | 0 | 0 | 0 | Not selected |
| 1 | 0 | 0 | 1 | 0 | Not selected |
| 1 | 0 | 1 | 0 | 1 | "L" write normal mode |
| 1 | 0 | 1 | 1 | 1 | "H" write normal mode |
| 1 | 1 | 0 | 0 | 0 | Not selected |
| 1 | 1 | 0 | 1 | 0 | Not selected |
| 1 | 1 | 1 | 0 or 1 | 1 | Read normal mode |
| 1 | 1 | 1 | 0 or 1 | 1 | Read normal mode |

FIG.14
PRIOR ART

| WE | DI | Bit | $\overline{\text{Bit}}$ |
|----|----|----|----|
| 0 | 0 | 0 | 1 |
| 0 | 1 | 1 | 0 |
| 1 | 0 | z | z |
| 1 | 1 | z | z |

"L" write mode
"H" write mode
Read mode
Read mode

SEMICONDUCTOR MEMORY DEVICE WITH SWITCHING ELEMENT FOR ISOLATING BIT LINES DURING TESTING

FIELD OF THE INVENTION

The present invention relates to a semiconductor recording apparatus, and more particularly to a semiconductor recording apparatus such as a static random access memory (described as SRAM hereinafter) reducing the required for a data-retention failure test.

BACKGROUND OF THE INVENTION

Generally, when there is any defect such as faulty connection in a memory cell of an SRAM, data at H-level written in the memory cell may sometimes be lost during the passage of a long period of time. In order to test for such a defect, there is executed a test (retention test) by writing H-level data in a memory cell and reading out the data from the memory cell after a specified period of time passes to check whether H-level data is retained. It should be noted that description is made based on the positive logic in the specification unless otherwise specified.

FIG. 12 is a circuit diagram showing a portion of circuit configuration of an SRAM based on the conventional technology. Although FIG. 12 shows four memory cells, each of which is of a CMOS type, in an actual case, each of the memory cells is arranged in a M×N (M and N are integers) matrix. The memory cell 1 comprises access transistors Q1, Q2 used as switches for connection to the bit lines 2, 3; and P channel and N channel transistors Q3, Q4, Q5, Q6 constituting a pair of CMOS inverters of a flip-flop.

The source and drain of the access transistor Q1 are connected to the bit line 2 as well as to an input of one of CMOS inverters and a gate thereof is connected to a word line 4. The source and drain of the access transistor Q2 are connected to the bit line 3 as well as to an input of the other CMOS inverter and a gate thereof is connected to the word line 4. Each output of the pair of CMOS transistors is connected to an input of the other CMOS transistor respectively. When a potential at the word line 4 connected to the memory cell 1 becomes H-level, the access transistors Q1, Q2 of this memory cell 1 enter into ON state, the flip-flop comprising the transistors Q3, Q4, Q5, and Q6 is connected to the bit lines 2, 3, data is written in this flip-flop, and the written data is retained.

The bit lines 2, 3 are connected to a write driver 5 as well as to a sense amplifier (SA) 6 via selector transistors Q7, Q8 as switches for selecting the bit lines 2, 3 respectively. The sense amplifier 6 is connected to a data output (DO) terminal 8 via a data output buffer 7. Gates of the selector transistors Q7, Q8 are connected to a column address decoder 9. The column address decoder 9 is connected to a column address input (An to Am) terminal 11 via a column address buffer 10. In addition, the bit lines 2, 3 are connected to transistors Q9, Q10 as resistors respectively. The word line 4 is connected to a row address decoder 12. The row address decoder 12 is connected to a row address input (A1 to An-1) terminal 14 via a row address buffer 13.

FIG. 13 shows a configuration of the write driver 5. The write driver 5 is configured with a write-driver control circuit 20 (Refer to FIG. 12) comprising two dual-input NAND gates 21, 22, two dual-input NOR gates 23, 24, and three inverters 25, 26, and 27 as well as with P channel and N channel transistors Q11, Q12, Q13, and Q14 constituting a pair of CMOS inverters. The write driver 5 is connected to a data input (DI) terminal 28 as well as to a write enable (WE) terminal 29.

The data input terminal 28 is connected to a first input terminal of the NAND gate 21 as well as to a first input terminal of the NOR gate 23, and also connected to a first input terminal of the other NAND gate 22 as well as to a first input terminal of the NOR gate 24 via the inverter 25. The write enable terminal 29 is connected to second input terminals of the NOR gates 23, 24, and also connected to second input terminals of the NAND gates 21, 22 via inverters 26 and 27 respectively.

Output terminals of the NAND gate 21 and NOR gate 23 are connected to gates of the P channel transistor Q11 and the N channel transistor Q12, and an output signal from a CMOS inverter formed with the pair of transistors Q11, Q12 is supplied to the bit line 2. Output terminals of the NAND gate 22 and NOR gate 24 are connected to gates of the P channel transistor Q13 and the N channel transistor Q14, and an output signal from a CMOS inverter formed with the pair of transistors Q13, Q14 is supplied to the other bit line 3.

FIG. 14 explains the operations of the write driver 5. When the write enable signal WE is "0" and the input data signal DI is "0", mode of writing L-level data in the memory cell 1 is effected, and signals outputted to the bit line 2 and the bit line 3 are "0" and "1" respectively. When the write enable signal WE is "0" and the input data signal DI is "1", mode of writing H-level data in the memory cell 1 is effected, and signals outputted to the bit line 2 and the bit line 3 are "1" and "0" respectively. When the write enable signal WE is "1", data reading mode is effected, and both of the bit line 2 and bit line 3 enter a high impedance state ("Z").

Let us consider a case, as shown in FIG. 15, in which the connection between the source of the P channel transistor Q3 as a load transistor in the memory cell 1 and the power terminal is faulty. In such a case, in the conventional type of SRAM described above, if H-level data is written in the memory cell 1, charge supplied from the write driver 5 is accumulated, immediately after the data is written, at a drain of the transistor Q3 (point B in FIG. 15), namely at an output point of the CMOS inverter including the transistors Q3, Q4. Therefore, the memory cell 1 retains H-level data.

However, the charge accumulated at the point B disappears due to leakage in association with the passage of time. On the other hand, charge is not supplied from the transistor Q3, so that the memory cell 1 becomes unstable. If data is read from such a memory cell 1, the same data as the written data, namely ordinary data can be read immediately after the data is written, but faulty data is read after the passage of a long period of time. Therefore, a retention test has to be carried out after a prespecified period of time since data is written, which disadvantageously requires a longer time for testing.

SUMMARY OF THE INVENTION

It is an object of the present invention to obtain, for the purpose of solving the problems as described above, a semiconductor recording apparatus which can carry out a retention test in a shorter period of time.

In the present invention, when data writing is executed in test mode, bit lines are insulated from a power source, a potential of one bit line possibly turning ON either one of a P channel transistor for retaining data at a relatively higher potential level and a P channel transistor for retaining data at a relatively lower potential level is set to a relatively lower potential level, and the other bit line possibly turning ON the other P channel transistor becomes high impedance.

In the present invention, when data writing is executed in test mode, a bit line to be shifted to a high impedance state is set once to a relatively lower potential level, and then enters high impedance.

In the present invention, when data writing is executed in test mode, bit lines are insulated from a power source, and one of the bit lines to be set to a relatively lower potential level is validated, while the other bit line possibly set to a relatively higher potential level is invalidated.

In the present invention, when data writing is executed in test mode, bit lines are insulated from a power source, and a memory cell is connected to one of the bit lines to be set to a relatively lower potential level and is insulated from the other bit line possibly set to a relatively higher potential level.

Other objects and features of this invention will become understood from the following description with reference to the accompanying drawings.

BRIEF DESCRIPTION OF THE DRAWINGS

FIG. 3 explains the operations of the write driver configured as shown in FIG. 2;

FIG. 8 explains the operations of a bit select circuit according to Embodiment 2;

FIG. 11 explains the operations of a memory cell configured as shown in FIG. 10;

FIG. 14 explains the operations of the write driver configured as shown in FIG. 13.

DESCRIPTION OF THE PREFERRED EMBODIMENTS

Detailed description is made hereinafter for the preferred embodiments of a semiconductor recording apparatus according to the present invention with reference to the attached drawings.

Figure 1:
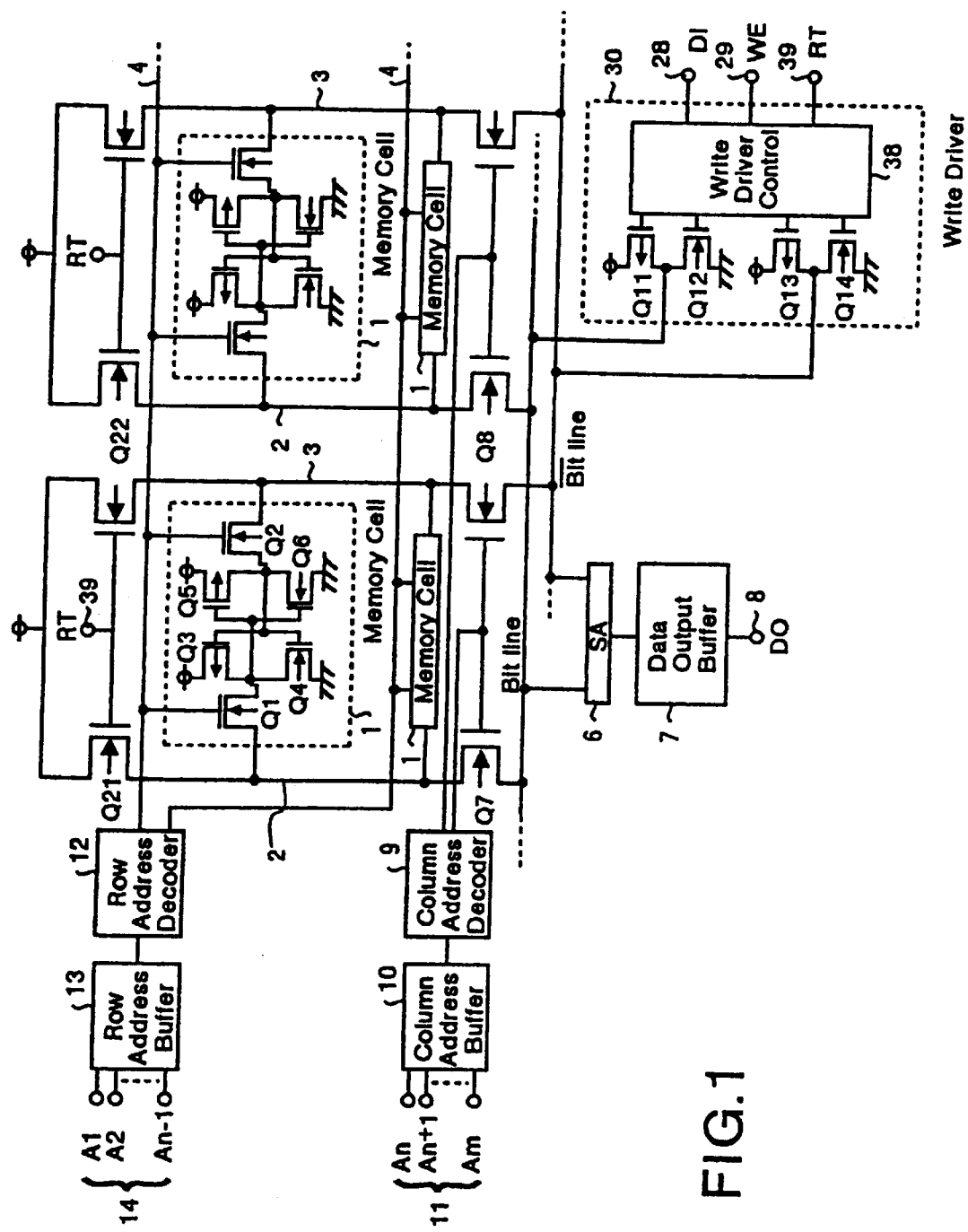
FIG. 1 is a circuit diagram showing Embodiment 1 of the present invention.

FIG. 1 is a circuit diagram showing a portion of circuit configuration of an SRAM as a semiconductor recording apparatus with the present invention applied thereto. This figure shows a portion of a M×N matrix in the same manner as FIG. 12. The SRAM in Embodiment 1 has switching functions instead of resistive transistors Q9, Q10 in the SRAM shown in FIG. 12. The function is configured with N-channel transistors Q21, Q22 connected to the bit lines 2, 3 respectively and turns ON/OFF the transistors Q21, Q22 according to a signal (called as a retention test signal RT hereinafter) inputted into each gate of the transistors Q21, Q22.

Figure 12:
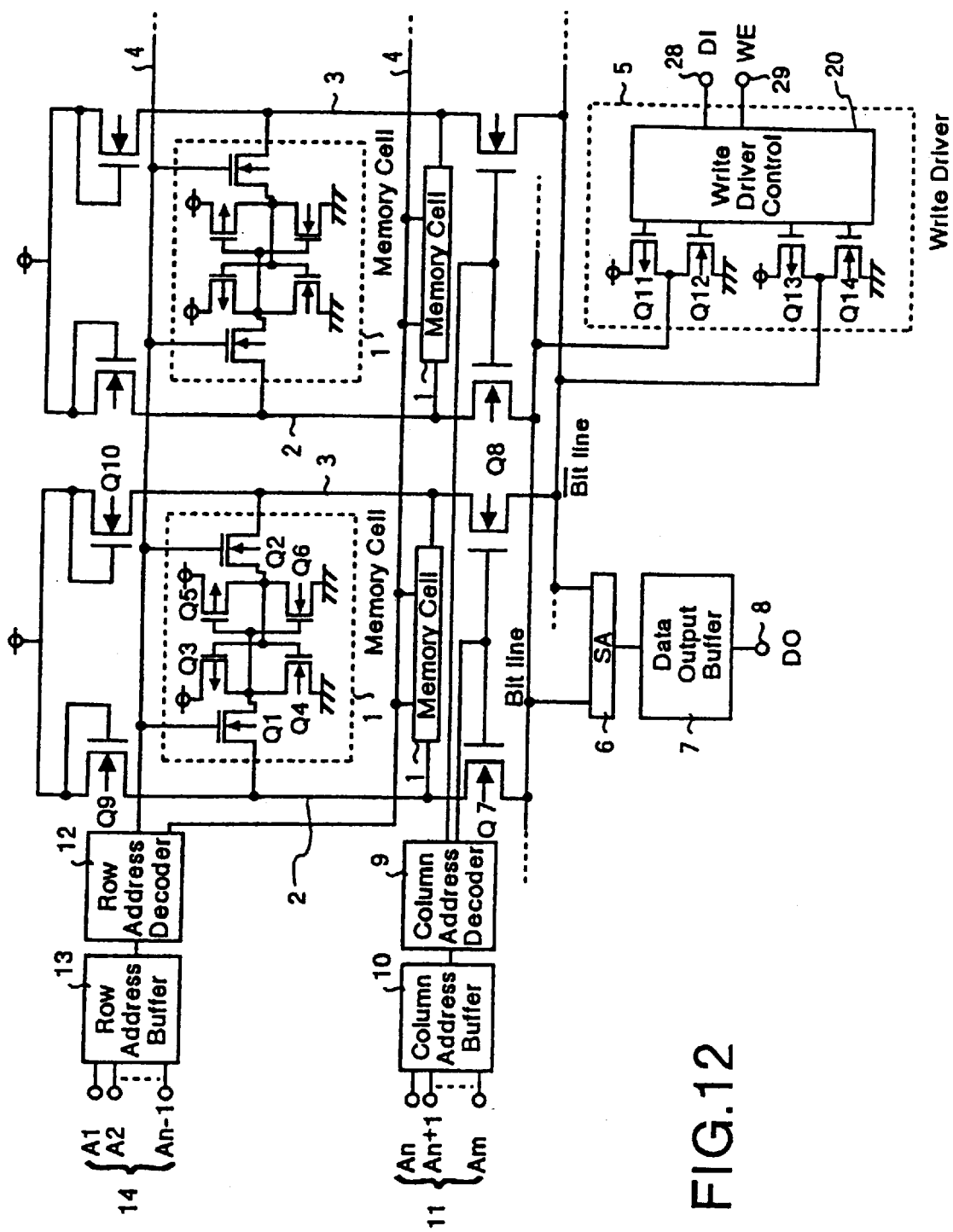
FIG. 12 is a circuit diagram showing a portion of circuit configuration of an SRAM based on the conventional technology.

The SRAM according to Embodiment 1 has a write driver 30 operating according to a write enable signal WE, an input data signal DI, and the retention test signal RT instead of the write driver shown as 5 in FIG. 12. The same reference numerals are assigned to components in the configuration of the SRAM shown in FIG. 1 which are same as in FIG. 12, and detailed description thereof is omitted herein.

Figure 2:
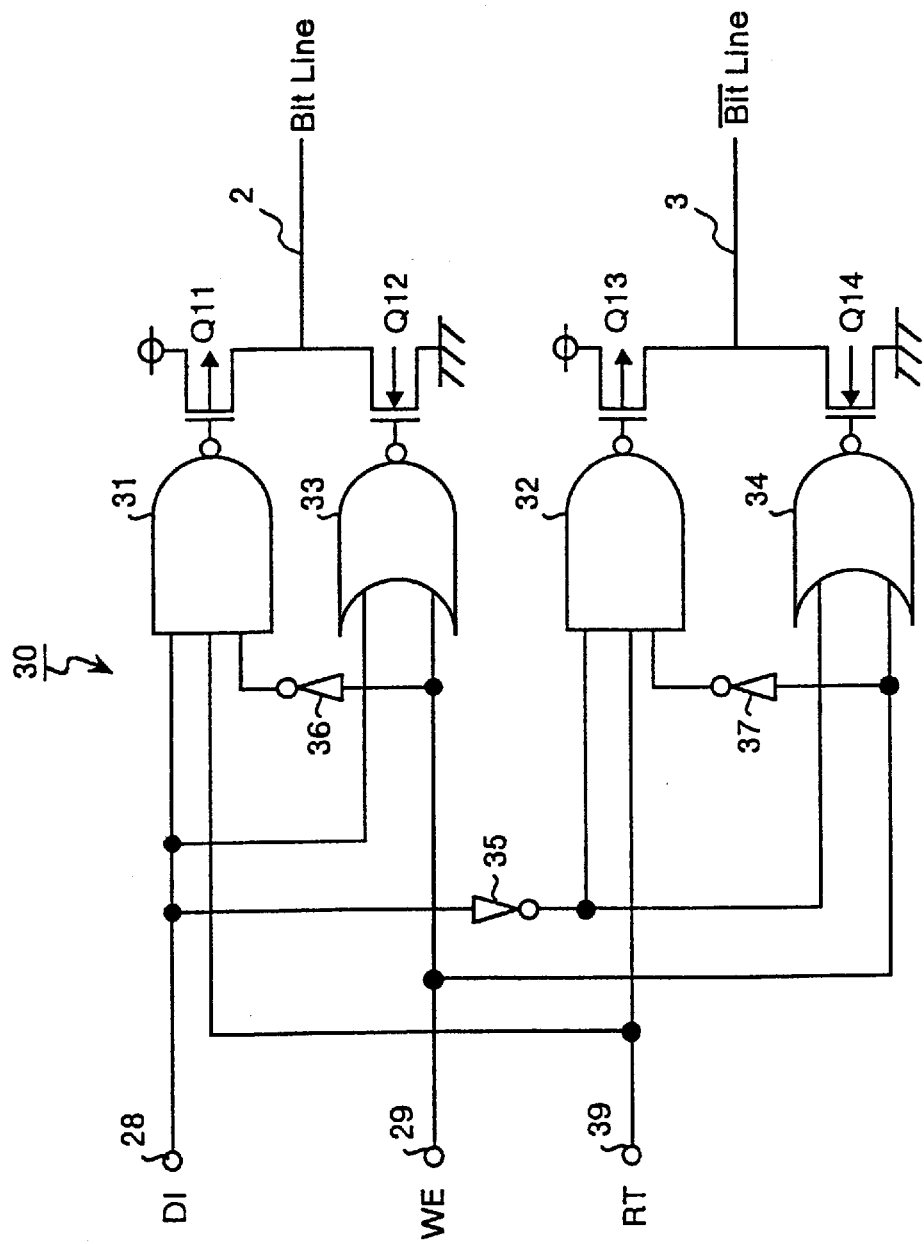
FIG. 2 is a circuit diagram showing an example of a write driver according to Embodiment 1.

FIG. 2 is a circuit diagram showing a configuration of the write driver 30. The write driver 30 has a write-driver control circuit 38 (Refer to FIG. 1) comprising two triple-input NAND gates 31, 32, two dual-input NOR gates 33, 34, and three inverters 35, 36, and 37.

Output terminals of the NAND gate 31 and the NOR gate 33 are connected to gates of P channel transistor Q11 and N channel transistor Q12 respectively constituting a CMOS inverter. Output signal from the CMOS inverter is supplied to the bit line 2. Output terminals of the NAND gate 32 and the NOR gate 34 are connected to gates of P channel transistor Q13 and N channel transistor Q14 respectively constituting a CMOS inverter. Output signal from the CMOS inverter is supplied to the bit line 3.

The data input terminal 28 is connected to a first input terminal of the NAND gate 31 as well as to a first input terminal of the NOR gate 33, and also connected to a first input terminal of the NAND gate 32 as well as to a first input terminal of the NOR gate 34 via the inverter 35. The write enable terminal 29 is connected to second input terminals of the NOR gates 33, 34, and also connected to second input terminals of the NAND gates 31, 32 via the inverters 36 and 37 respectively. A retention test signal input terminal 39 with a retention test signal RT inputted thereinto is connected to third input terminals of the AND gates 31 and 32.

FIG. 3 explains the operations of the write driver 30. When the retention test signal RT is "0", write/read mode in a retention test is effected, and when a retention test signal RT is "1", normal write/read mode is effected. When the retention test is executed, namely when a retention test signal RT is "0", the following states from (1) to (3) are effected.

(1) When the write enable signal WE is "0" and the input data signal DI is "0", a signal "0" is outputted into the bit line 2, and the bit line 3 goes into high impedance ("Z"). Therefore, the P channel transistor Q5 and the N channel transistor Q4 in the memory cell 1 enter into ON state, and L-level data is retained.

(2) When the write enable signal WE is "0" and the input data signal DI is "1", the bit line 2 goes into high impedance, and a signal "0" is outputted to the bit line 3. Therefore, the P channel transistor Q3 and the N channel transistor Q6 in the memory cell 1 enter into ON state, and H-level data is retained.

(3) When the write enable signal WE is "1", both the bit lines 2 and 3 go into high impedance regardless of whether the input data signal DI is "0" or "1", thus a read test mode is effected.

During ordinary operation, namely when the retention test signal RT is "1", the following states from (4) to (6) are effected.

(4) When the write enable signal WE is "0" and the input data signal DI is also "0", signals to be outputted to the bit line 2 and bit line 3 are "0" and "1" respectively. Therefore, L-level data is written in the memory cell 1 and retained.

(5) When the write enable signal WE is "0" and the input data signal DI is "1", signals to be outputted to the bit line 2 and bit line 3 are "1" and "0" respectively. Therefore, H-level data is written in the memory cell 1 and retained.

(6) When the write enable signal WE is "1", both the bit lines 2 and 3 go into high impedance regardless of whether the input data signal DI is "0" or "1", thus normal read mode being effected.

Figure 4:
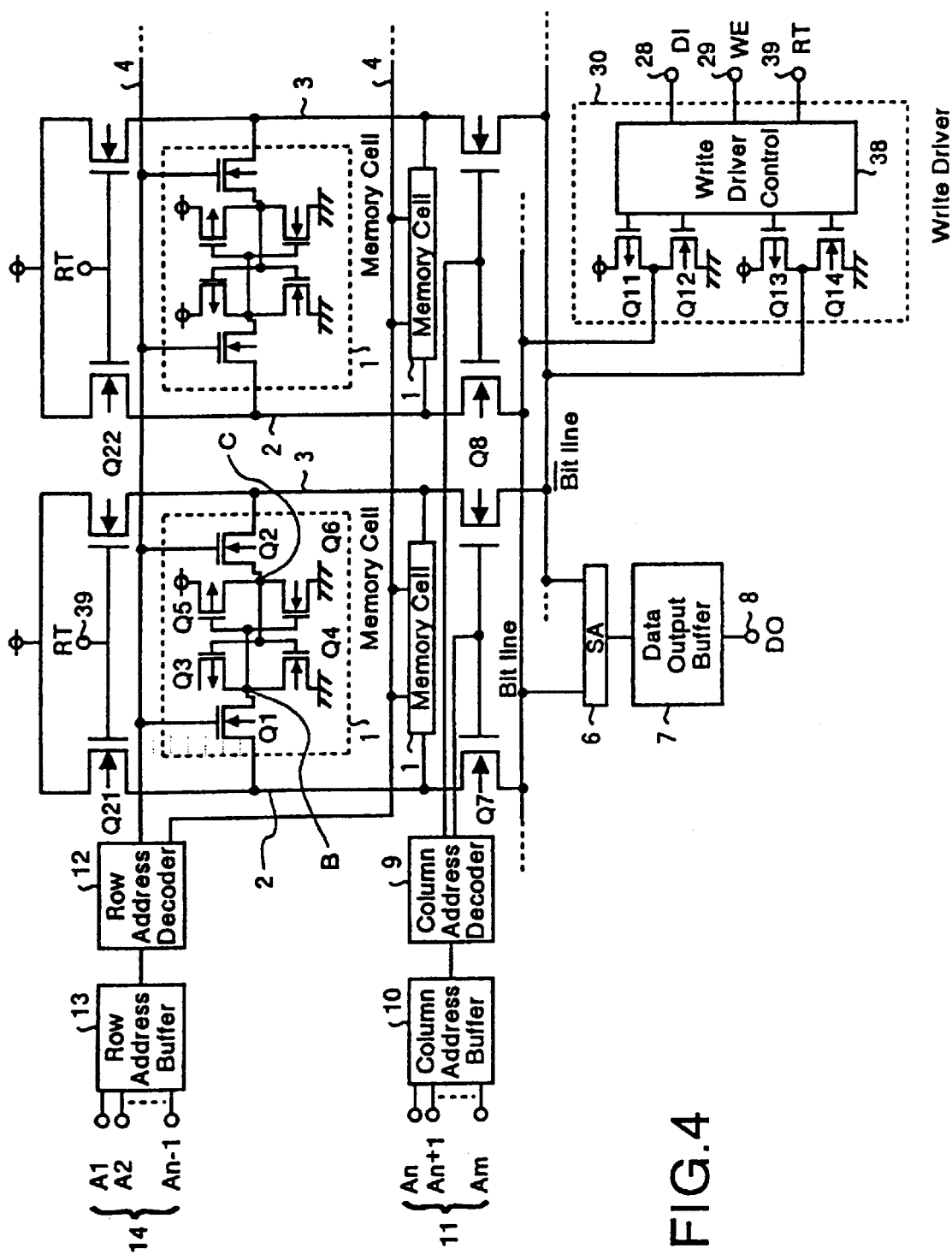
FIG. 4 is a circuit diagram when there is faulty connection in the semiconductor recording apparatus according to Embodiment 1.

Next description is made for effects of Embodiment 1 with reference to FIG. 4. FIG. 4 shows a state where there is faulty connection between a source of the P channel transistor Q3 and a power terminal in the memory cell 1. Since the retention test signal RT is "0" in the retention test mode, the transistors Q21, Q22 connected to the bit lines 2, 3 respectively enter into OFF state. Therefore, charge at H-level is not fed from the transistors Q21, Q22 to the bit lines 2, 3, so that H-level charge is not fed to a drain (Point B in FIG. 4) of the P channel transistor Q3 in the memory cell 1.

When a write test is executed with respect to H-level data in this state, the bit line 2 enters high impedance (Refer to FIG. 3), therefore charge at H-level is not fed from the write driver 30 to the drain (Point B in FIG. 4) of the P channel transistor Q3. The source of the P channel transistor Q3 is not connected to the power terminal, therefore, a potential at the drain (Point B in FIG. 4) of the P channel transistor Q3 does not go into H-level, so that H-level data is not resultantly retained in the memory cell 1. Therefore, the potential at the point B in the memory cell 1 with a faulty connection in the transistor Q3 is lower than the potential at the point B in a non-faulty memory cell 1. Hence, even if the retained data is read immediately after the write test is executed at the H-level data, the written data is not coincident with the read data.

With Embodiment 1, during execution of a retention test, the retention test signal RT turns the transistors Q21, Q22 connected to the bit lines 2, 3 into OFF state, and the write driver 30 places either one of the bit lines 2, 3 into high impedance and outputs "0" to the other bit line, so that H-level charge is not fed to both of the bit lines 2, 3. Therefore during execution of a retention test, a memory cell having a faulty connection therein can not retain H-level data, which allows a retention fault to be detected even when reading is executed immediately after the data is written, so that the time required for a retention test can be reduced drastically.

Figure 5:
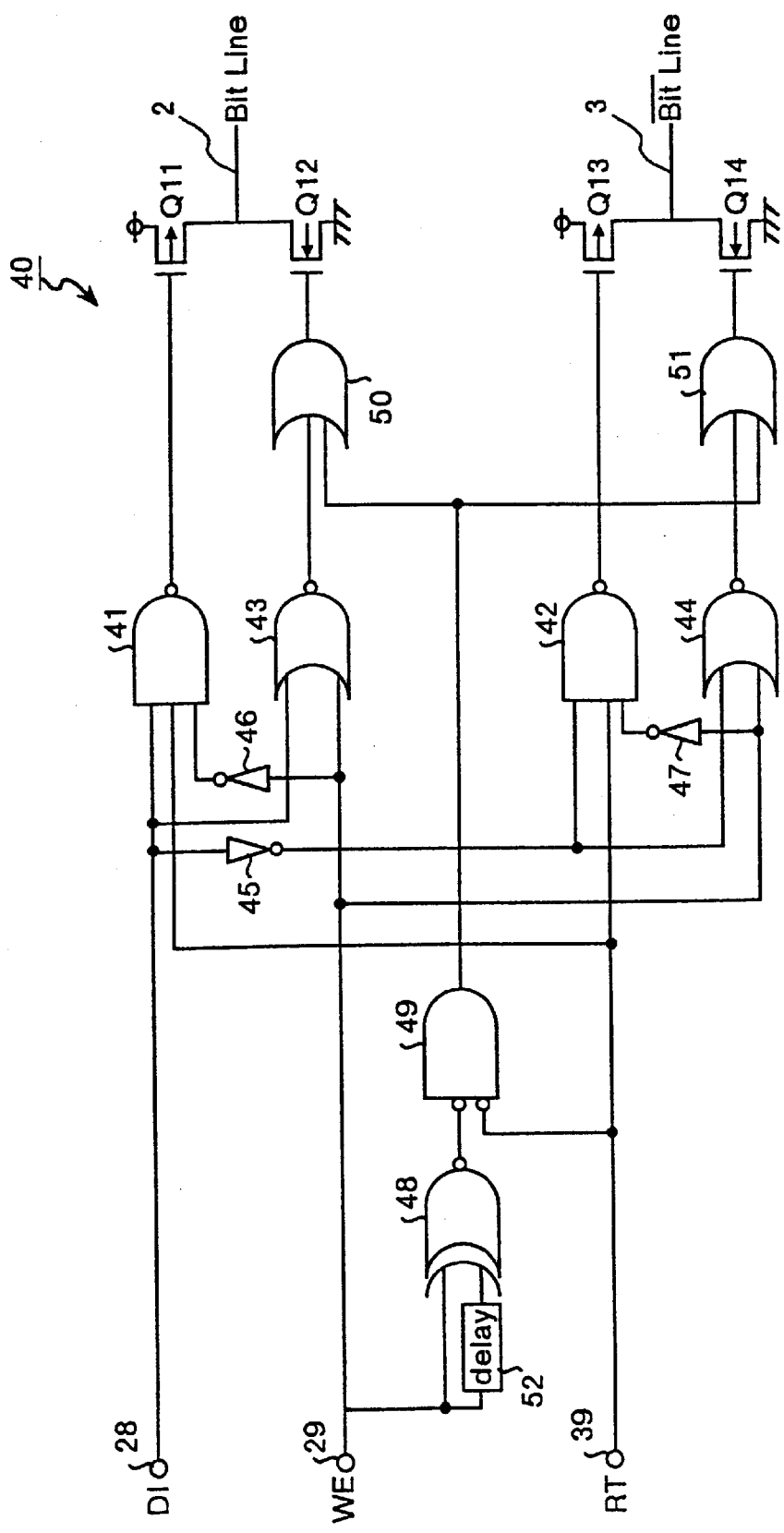
FIG. 5 is a circuit diagram showing another example of the write driver in Embodiment 1.

FIG. 5 is a circuit diagram showing another example of the write driver. The write driver 40 shown in FIG. 5 may be used in place of the write driver 30 in the circuit configuration of the SRAM shown in FIG. 1. Detailed description is made hereinafter for configuration of the write driver 40. The write driver 40 comprises two triple-input NAND gates 41, 42, two dual-input NOR gates 43, 44, three inverters 45, 46, 47, an ExNOR (Exclusive NOR) gate 48, a negative-logic NOR gate 49, two OR gates 50, 51 and a delay circuit 52.

Output terminals of NAND gate 41 and OR gate 50 are connected to gates of P channel transistor Q11 and N channel transistor Q12, respectively, constituting a CMOS inverter. Output signal from this CMOS inverter is supplied to the bit line 2. Output terminals of NAND gate 42 and OR gate 51 are connected to gates of P channel transistor Q13 and N channel transistor Q14, each constituting a CMOS inverter. Output signal from this CMOS inverter is supplied to the bit line 3.

The data input terminal 28 is connected to a first input terminal of the NAND gate 41 as well as to a first input terminal of the NOR gate 43, and also connected to a first input terminal of the NAND gate 42 as well as to a first input terminal of the NOR gate 44 via the inverter 45. The write enable terminal 29 is connected to second input terminals of the NOR gates 43, 44, and also connected to second input terminals of the NAND gates 41, 42 via the inverters 46 and 47 respectively. The retention test signal input terminal 39 is connected to third input terminals of the NAND gates 41 and 42.

Furthermore, the write enable terminal 29 is connected to a first input terminal of the ExNOR gate 48 and also connected to a second input terminal of the ExNOR gate 48 via the delay circuit. An output terminal of the ExNOR gate 48 and the retention test signal input terminal 39 are connected to input terminals of the NOR gate 49. An output terminal of the NOR gate 49 is connected to first input terminals of the two OR gates 50, 51 respectively. A second input terminal of the OR gate 50 is connected to an output terminal of the NOR gate 43. A second input terminal of the OR gate 51 is connected to an output terminal of the NOR gate 44.

Figure 6:
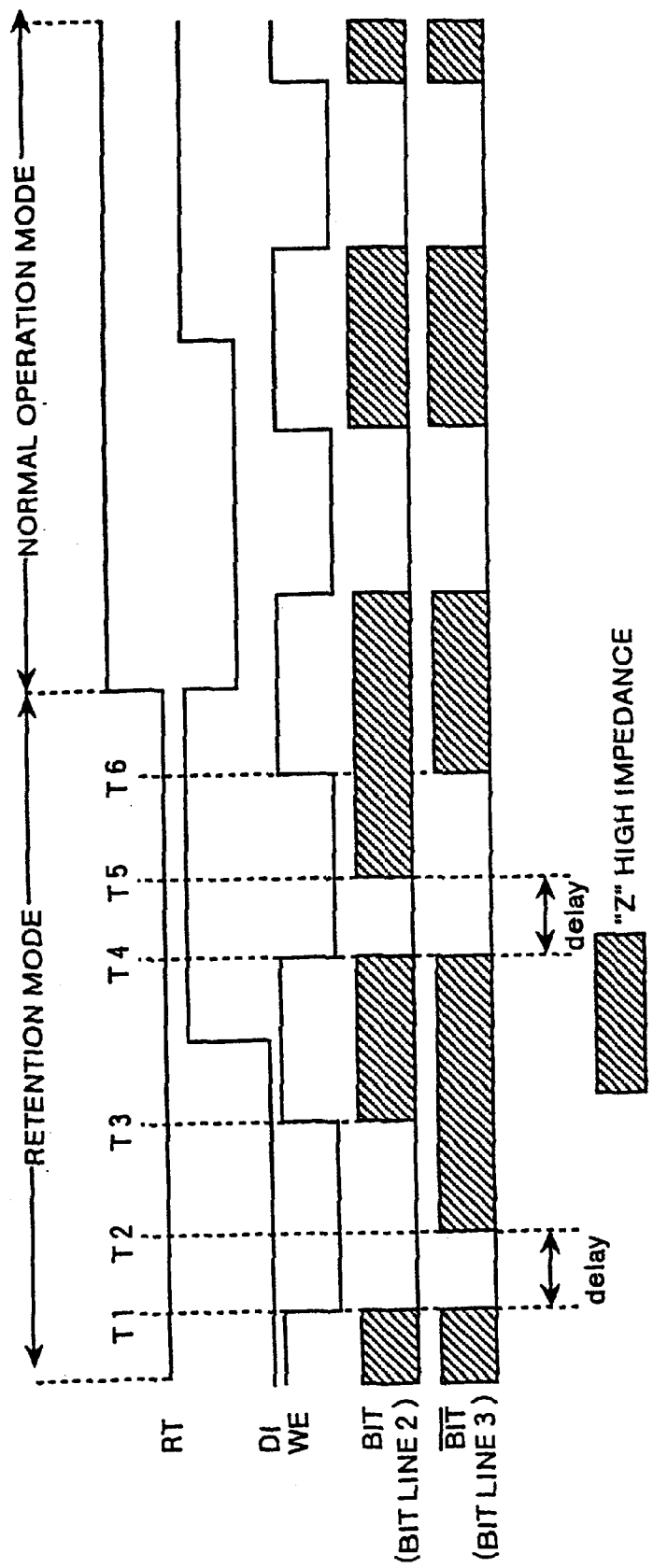
FIG. 6 is a timing chart explaining the operation timing of the write driver configured as shown in FIG. 5.

FIG. 6 is a timing chart explaining the operation timing of the write driver 40. By providing the delay circuit 52 therein, when L-level data is to be written in the memory cell 1 in the retention test mode, both the bit lines 2, 3 switch from a high impedance to a L-level in synchronism with timing T1 on the falling edge of the write enable signal WE.

Both of the bit lines 2, 3 go into a L-level, with which the charge accumulated at output points (Refer to FIG. 4; points B and C) of a pair of CMOS inverter in the memory cell 1 is lost. After this, only the bit line 3 goes into high impedance again at timing T2, delayed by a prespecified period of time, so that L-level data is written in the memory cell 1 and retained. Then, the bit line 2 goes into high impedance in synchronism with timing T3 on the rising edge of the write enable signal WE, and the read test mode is effected.

Similarly, when H-level data is to be written in the memory cell 1 in the retention test mode, both the bit lines 2, 3 switch from high impedance to L-level in synchronism with timing T4 on the falling edge of the write enable signal WE, and the charge accumulated at the point B and C in FIG. 4 is lost in the same manner as the timing between T1 and T2.

Then, only the bit line 2 goes into high impedance state again at timing T5, delayed by a prespecified period of time, so that H-level data is written in the memory cell 1 and retained. At the following timing T6, the write enable signal WE rises and the bit line 3 enters high impedance in synchronism with timing of the rising, and the read test mode is effected. In the normal operation mode, both the bit lines 2, 3 switch between H or L-level and high impedance state in synchronism with timing on the falling edge of the write enable signal WE.

As described above, when both the bit lines 2, 3 are at L-level for a prespecified period of time in the write mode of a retention test, the accumulated charge is lost, which allows a retention test to be executed more quickly.

Figure 7:
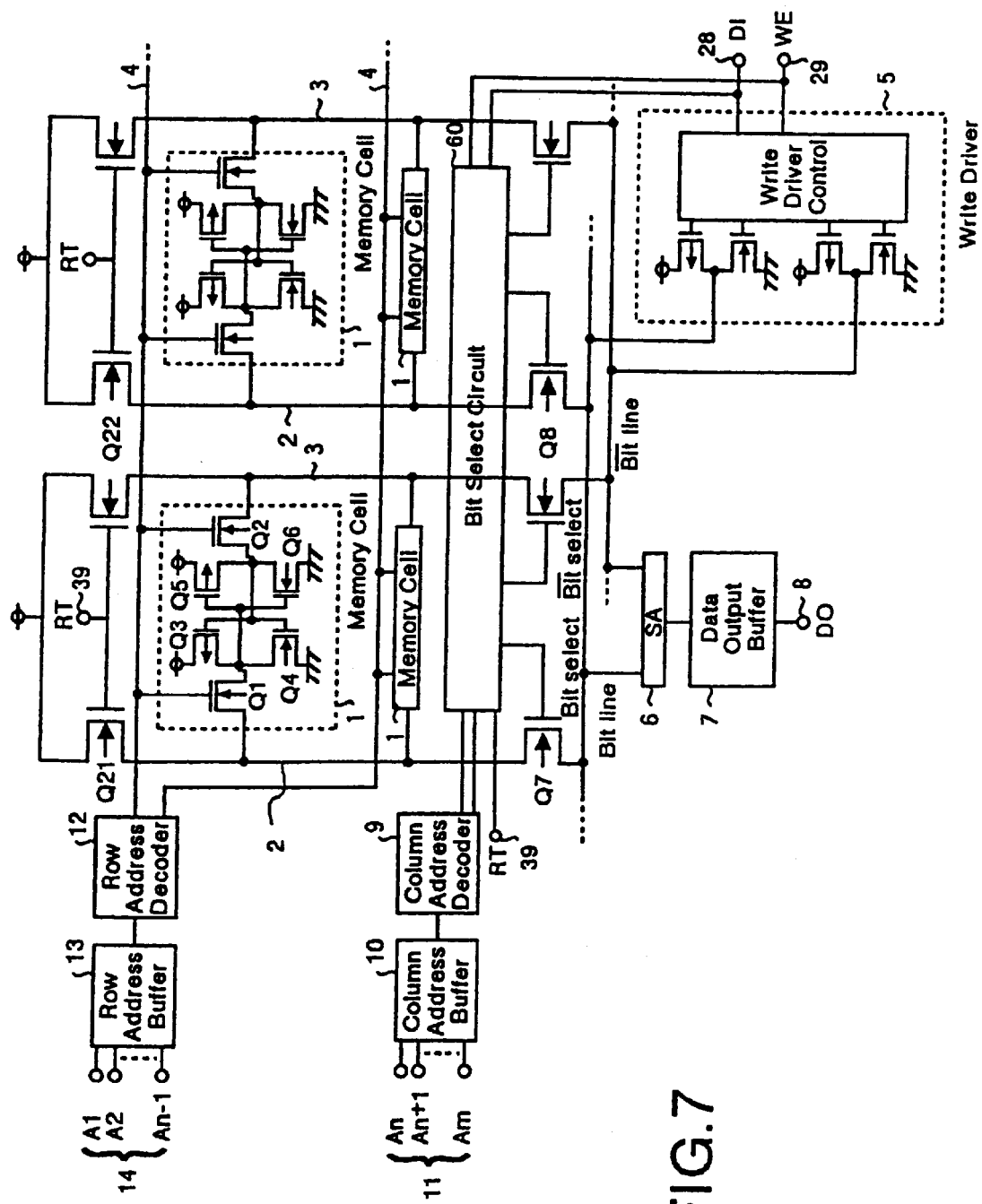
FIG. 7 is a circuit diagram showing Embodiment 2 of the present invention.

FIG. 7 is a circuit diagram showing a portion of a different circuit configuration of the SRAM as the semiconductor recording apparatus with the present invention applied thereto, and shows a portion of M×N matrix. The SRAM according to Embodiment 2 is different from that according to Embodiment 1 shown in FIG. 1 in the following two points. Firstly, there is provided a bit select circuit 60 for outputting a selection signal to gates of select transistors Q7, Q8 according to an output signal from a column address decoder 9, a retention test signal RT, an input data signal DI and a write enable signal WE to control the ON/OFF state of the select transistors Q7 and Q8. This bit select circuit 60 control the ON/OFF state of the select transistors Q7, Q8 connected to the bit lines 2, 3 respectively, instead of the column address decoder 9.

Figure 13:
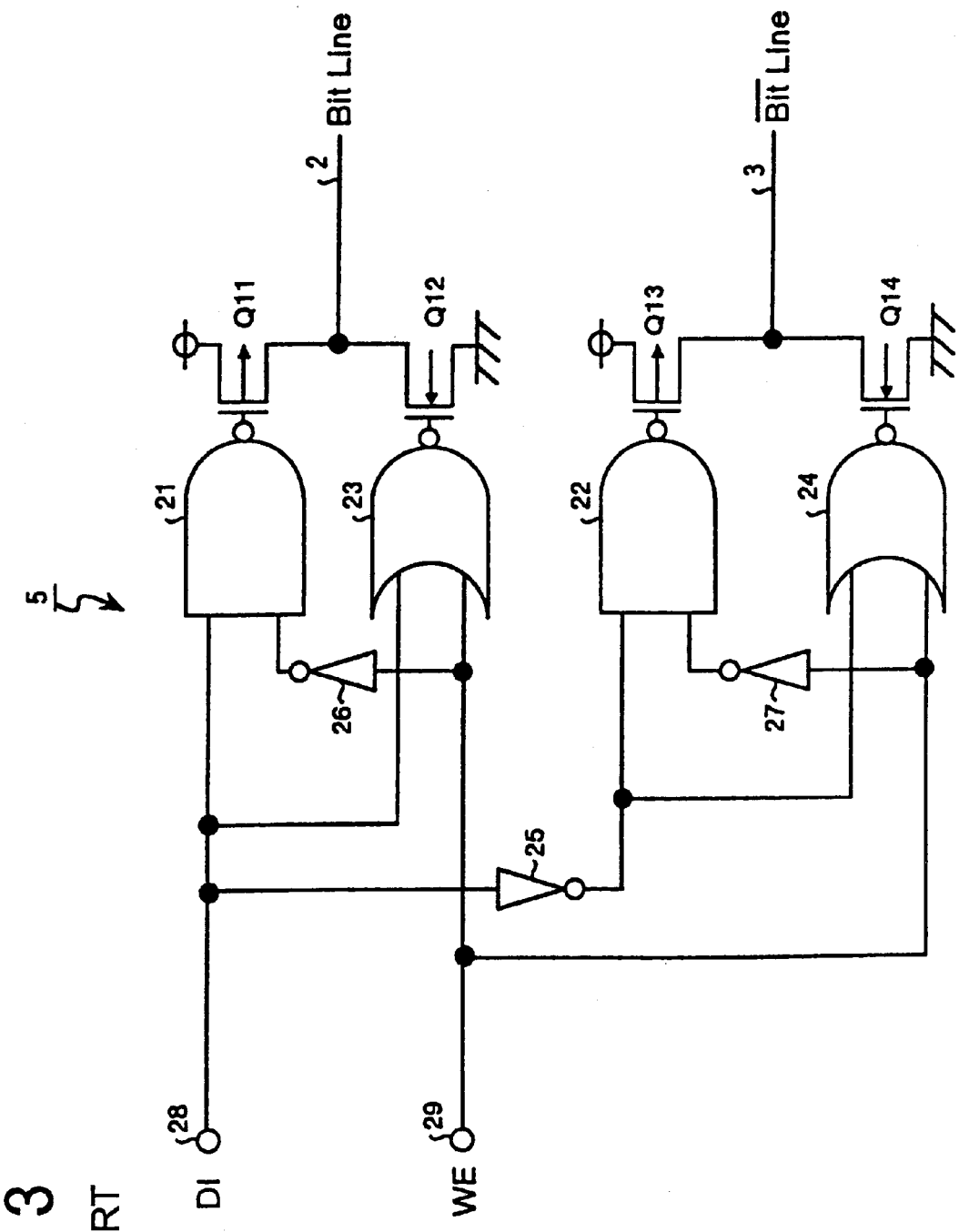
FIG. 13 is a circuit diagram showing configuration of a write driver in the SRAM based on the conventional technology.
Figure 15:
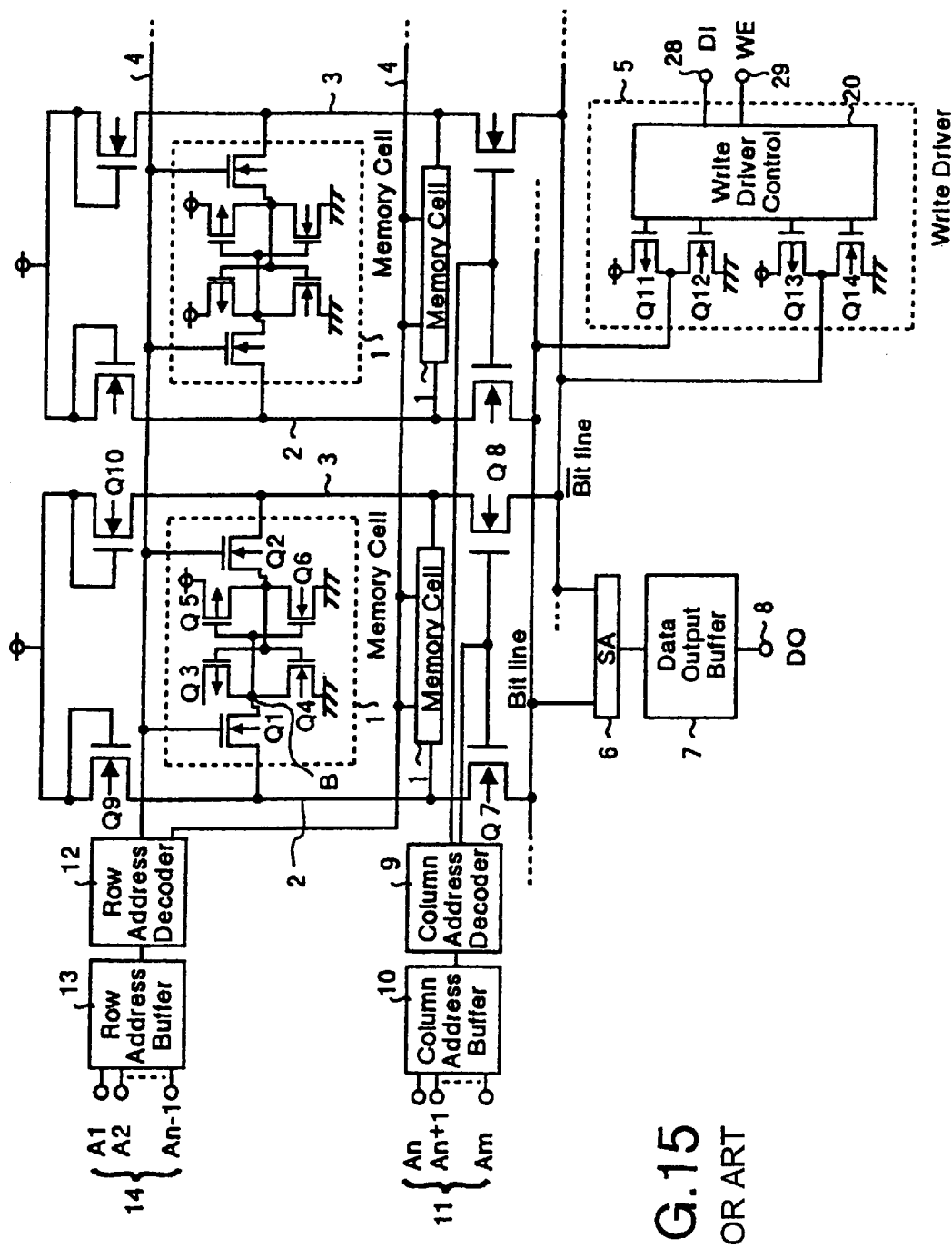
FIG. 15 is a circuit diagram when there is faulty connection in the SRAM shown in FIG. 12.

Secondly, a write driver 5 operating according to an input data signal DI and a write enable signal WE is used in place of a write driver 30 operating according to a retention test signal RT, an input data signal DI, and a write enable signal WE. The other components in Embodiment 2 are the same as those in Embodiment 1, so that the same reference numerals are assigned to components corresponding to those in Embodiment 1, and description thereof is omitted herein. The write driver 5 has been described with reference to FIG. 13 and the operation thereof has been described with reference to FIG. 14, so that description thereof is omitted herein to avoid overlap.

FIG. 8 explains the operations of the bit select control 60. When an output signal from the column address decoder 9 is "0", the bit lines 2, 3 corresponding to the address are in a not-selected state, and enter a selected state when the output signal is "1". When the retention test signal RT is "0" in the state where a pair of bit lines 2, 3 have been selected, retention test mode is effected, and the following states (7) to (9) are effected.

(7) When the write enable signal WE is "0" and the input data signal DI is "0", a selection signal to the bit line 2 is "0", namely enters H-level, and the select transistor Q7 enters ON state. While a selection signal to the bit line 3 is "0", namely enters the L-level, the select transistor Q8 enters OFF state, and the bit line 3 enters high impedance state. In this case, the write driver 5 outputs a signal "0" to the bit line 2 (Refer to FIG. 14), thus the P channel transistor Q5 and the N channel transistor Q4 in the memory cell 1 enter ON state, and L-level data is retained.

(8) When the write enable signal WE is "0" and the input data signal DI is "1", a selection signal to the bit line 2 enters "0", namely L-level, so that the select transistor Q7 enters OFF state, and the bit line 2 enters high impedance state. While a selection signal to the bit line 3 is "1", namely enters H-level, thus the select transistor Q8 enters ON state. In this case, the write driver 5 outputs a signal "0" to the bit line 3 (Refer to FIG. 14), so that the P channel transistorQ3 and the N channel transistor Q6 in the memory cell 1 enter ON state, and H-level data is retained.

(9) When the write enable signal WE is "1", both the selection signals to the bit lines 2 and 3 are "1", namely enter H-level regardless of whether the input data signal DI is "0" or "1", thus both of the select transistors Q7, Q8 enter ON state. In this case, both of the bit lines 2, 3 go into high impedance due to the write driver 5 (Refer to FIG. 14), thus read test mode being effected.

When the retention test signal RT is "1" in the state where a pair of bit lines 2, 3 have been selected, normal write/read mode is effected, and both of the selection signals to the bit lines 2, 3 are "1", namely enter H-level regardless of whether the write enable signal WE and the input data signal DI are "0" or "1", thus both of the select transistors Q7, Q8 enter ON state.

When the write enable signal WE is "0" and if the input data signal DI is "0", L-level data is written in the memory cell 1, but if the input data signal DI is "1", H-level data is written in the memory cell 1, and each of the data is retained. On the other hand, when the write enable signal WE is "1", both of the bit lines 2, 3 enter high impedance (Refer to FIG. 14), thus read mode being effected.

Figure 9:
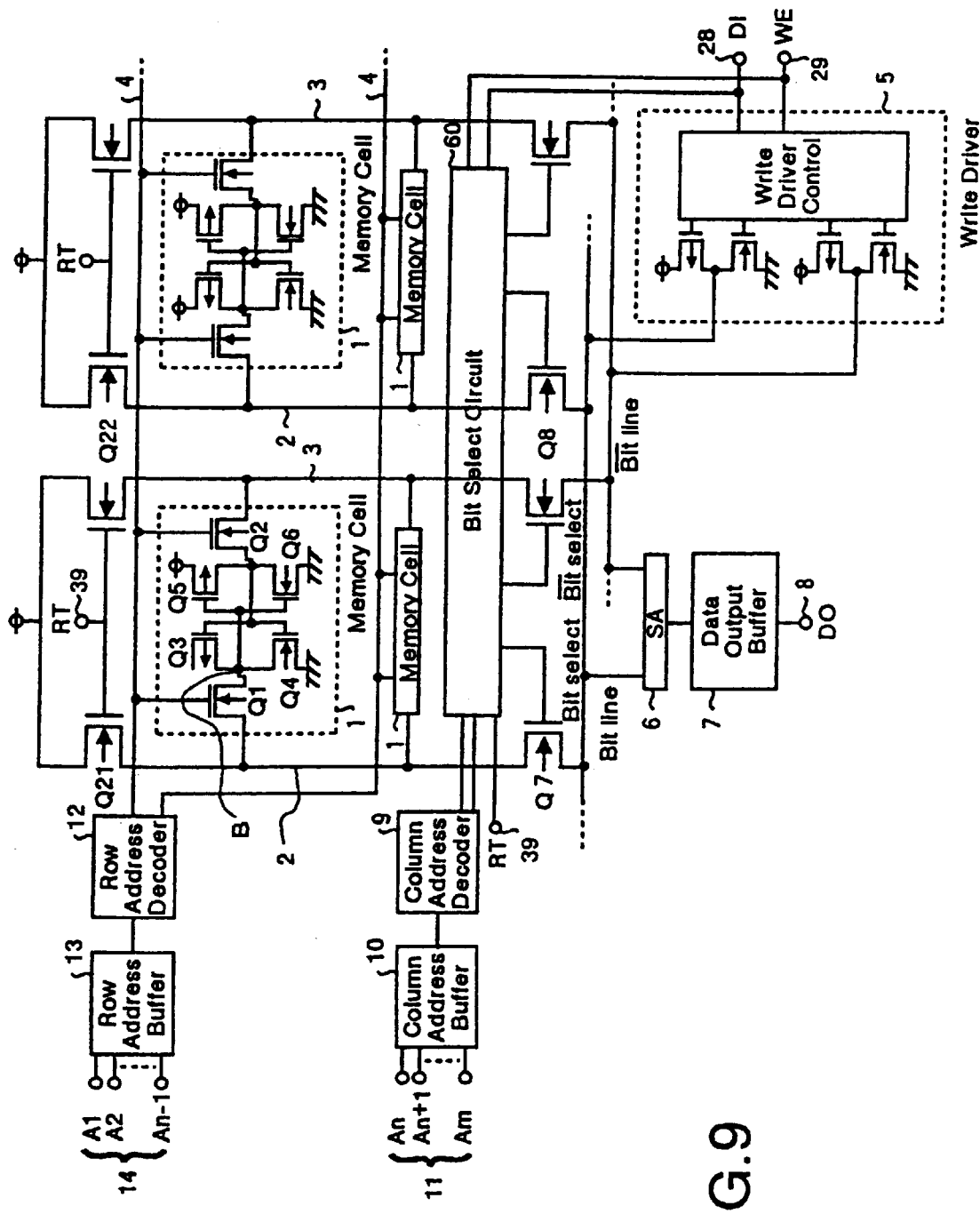
FIG. 9 is a circuit diagram when there is faulty connection in the semiconductor recording apparatus according to Embodiment 2.

Next, description is made for effects of Embodiment 2 with reference to FIG. 9. FIG. 9 shows a state where there is faulty connection between a source of the P channel transistor Q3 and a power terminal in the memory cell 1 of the SRAM according to Embodiment 2. In the retention test mode, similarly to Embodiment 1, the transistors Q21, Q22 connected to the bit lines 2, 3 respectively enter OFF state, thus charge at H-level is not fed from the transistors Q21, Q22 to the bit lines 2 and 3.

Further, when H-level data writing is to be tested, the bit line 2 enters high impedance due to the bit select control 60, so that charge at H-level is not supplied from the write driver 5 to the bit line 2. In this case, if connection between the source of the P channel transistor Q3 and the power terminal in the memory cell 1 is faulty, the potential at the drain (point B in FIG. 9) of the transistor Q3 does not go into H-level, so that H-level data is not retained in the memory cell 1. Therefore, it can be detected that the written data is not coincident with the read data even if retained data is read immediately after the writing of H-level data is tested.

With Embodiment 2, during execution of the retention test, the charge at the H-level is not supplied to the bit lines 2, 3, so that H-level data is not retained in the memory cell having a faulty connection therein. Therefore, a retention fault can be detected even when data is read immediately after the data is written, which allows the time required for a retention test to be reduced drastically.

Figure 10:
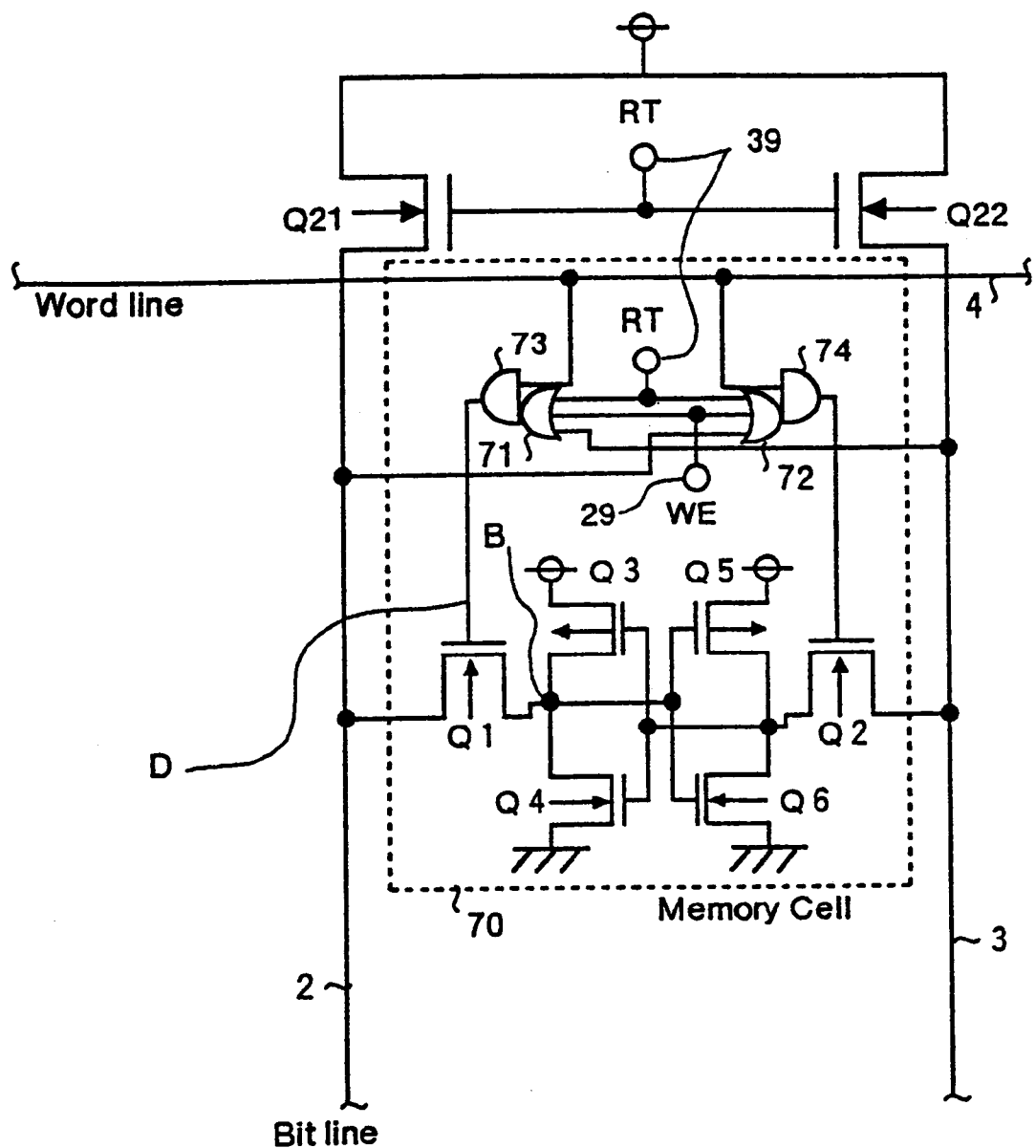
FIG. 10 is a circuit diagram showing Embodiment 3 of the present invention.

FIG. 10 is a circuit diagram showing configuration of a memory cell as an another example of the SRAM as the semiconductor recording apparatus with the present invention applied thereto. This memory cell 70 is configured by providing therein a logic circuit for outputting a control signal to gates of the access transistors Q1, Q2 in the memory cell 70 according to each signal of the word line 4, bit lines 2, 3, a retention test signal RT, and to a write enable signal WE, and controlling ON/OFF of the access transistors Q1, Q2 by the logic circuit.

The other components in the memory cell 70 are the same as those of the memory cell 1 in Embodiment 1 shown in FIG. 1, so that the same reference numerals are assigned to components corresponding to those in Embodiment 1, and description thereof is omitted herein. Although the components other than the memory cell 70 in the SRAM having this memory cell 70 are not shown in FIG. 10, the configuration is the same as that in Embodiment 1 only that the ordinary write driver 5 used instead of the write driver 30.

The memory cell 70 comprises, in addition to the configuration of the memory cell 1 in Embodiment 1, two triple-input OR gates 71, 72 and two AND gates 73, 74. First, second, and third input terminals of the OR gate 71 are connected to a retention test signal input terminal 39, a write enable terminal 29, and a bit line 3 respectively. The two input terminals of the AND gate 73 are connected to a word line 4 and an output terminal of the OR gate 71 respectively.

Similarly, first, second, and third input terminals of the OR gate 72 are connected to the retention test signal input terminal 39, the write enable terminal 29, and the bit line 2 respectively. The two input terminals of the AND gate 74 are connected to the word line 4 and an output terminal of the OR gate 72 respectively. Output terminal of the AND gate 73 and an output terminal of the AND gate 74 are connected to a gates of the access transistor Q1 and access transistor Q2 respectively.

FIG. 11 explains the operations of the memory cell 70. When a signal of the word line 4 is "0", the word line 4 is in a not-selected state, and enters a selected state when the signal is "1". When the retention test signal RT is "0" in the state where the word line 4 has been selected, retention test mode is effected, and the following states (10) to (12) are effected.

(10) When the write enable signal WE is "0" and the signal of the bit line 2 is "0", an input signal to the gate (point D shown in FIG. 10) of the access transistor Q1 is "1", namely enters H-level, and the access transistor Q1 enters ON state. Therefore, the P channel transistor Q5 and the N channel transistor Q4 in the memory cell 70 enter ON state, and L-level data is retained.

(11) When the write enable signal WE is "0" and the signal of the bit line 2 is "1", an input signal to the gate (pint D in FIG. 10) of the access transistor Q1 is "0", namely enters L-level, and the access transistor Q1 enters OFF state. In this case, the signal of the bit line 3 is "0" and the access transistor Q2 enters ON state, and H-level data is retained.

(12) When the write enable signal WE is "1", input signal to the gate (point D in FIG. 10) of the access transistor Q1 is "1", namely enters H-level regardless of whether the signal of the bit line 2 is "0" or "1", and the access transistor Q1 enters ON state. In this case, both of the bit lines 2, 3 enter into high impedance due to the write driver 5 (Refer to FIG. 14), thus read test mode being effected.

When a retention test signal RT is "1" in the state where the word line 4 has been selected, normal write/read mode is effected. In this mode, if the write enable signal WE is "0", an input signal to the gate (point D in FIG. 10) of the access transistor Q1 is "1", namely enters H-level, and the access transistor Q1 enters ON state.

In this case, when the signal of the bit line 2 is "0", L-level data is retained, while H-level data is retained when the signal of the bit line 2 is "1". In the normal mode, if the write enable signal WE is "1", an input signal to the gate (point D in FIG. 10) of the access transistor Q1 is "1", namely enters H-level regardless of whether the signal of the bit line 2 is "0" or "1", and the access transistor Q1 enters ON state. In this case, both of the bit lines 2, 3 enter into high impedance due to the write driver 5 (Refer to FIG. 14), thus read mode being effected.

Next, description is made for effects of Embodiment 3. When data is written in the retention test mode, the access transistors Q1, Q2 connected to the bit lines 2, 3 respectively enter OFF state when the bit lines 2, 3 connected thereto are in H-level. Therefore, only the bit lines 2, 3 at L-level are connected to the memory cell 70, thus charge at H-level is not supplied from outside to the memory cell 70.

In this case, if connection between the source of the P channel transistor Q3 and the power terminal in the memory cell 70 is faulty, the potential at the drain (point B in FIG. 10) of the transistor Q3 does not go into H-level, so that H-level data is not retained in the memory cell 70. Therefore, it is detected that the written data is not coincident with the read data even if retained data is read immediately after writing of H-level data is tested.

With Embodiment 3, when data is written in the retention test, the bit lines 2, 3 are connected to the memory cell 70 only when they are in L-level, so that charge at H-level is not fed from outside to the memory cell 70, and the memory cell with any faulty connection therein can not retain H-level data. Therefore, retention fault can be detected even when data is read immediately after the data is written, which allows the time required for a retention test to be reduced drastically.

In the above mentioned embodiments, although description has been made for the case where there is a faulty connection in the P channel transistor Q3 of the memory cell 70, the same effect can be obtained even when there is faulty connection in the other P channel transistor Q5 of the memory cell 1 or 70.

Further, in the above mentioned embodiments, although description has been made for the SRAM, the present invention is not limited to the SRAM described above but is to be construed as embodying all modifications and alternative constructions that may occur to one skilled in the art which fairly fall within the basic teaching herein set forth.

As described above, with the present invention, when data writing is executed in test mode, bit lines are insulated from a power source, a potential of one bit line possibly turning ON either one of a P channel transistor for retaining data at a relatively higher potential level and a P channel transistor for retaining data at a relatively lower potential level is set to a relatively lower potential level, and the other bit line possibly turning ON the other P channel transistor becomes high impedance, so that charge at H-level is not fed to the bit line. Therefore, during execution of a retention test, a memory cell with any faulty connection therein can not retain H-level data even immediately after data is written, so that retention fault can be detected even when data is read immediately after the data is written, which allows the time required for a retention test to be reduced.

With the invention according to another aspect of the present invention, when data writing is executed in test mode, a bit line to be entered into high impedance is set once to a relatively lower potential level, and then enters high impedance, so that charge accumulated in the bit line and a memory cell is removed, which allows the retention test to more quickly be executed.

With the invention according to another aspect of the present invention, when data writing is executed in test mode, bit lines are insulated from a power source, and one of the bit lines to be set to a relatively lower potential level is validated, while the other bit line possibly set to a relatively higher potential level is invalidated, so that charge at H-level is not fed to the bit lines. Therefore, during execution of a retention test, a memory cell with any faulty connection therein cannot retain H-level data even immediately after data is written, so that retention fault can be detected even when data is read immediately after the data is written, which allows the time required for a retention test to be reduced.

With the invention according to another aspect of the present invention, when data writing is executed in test mode, bit lines are insulated from a power source, and a memory cell is connected to one of the bit lines to be set to a relatively lower potential level and is insulated from the other bit line possibly set to a relatively higher potential level, so that charge at H-level is not fed from the bit line to the memory cell. Therefore, during execution of a retention test, a memory cell with any faulty connection therein can not retain H-level data even immediately after data is written, so that retention fault can be detected even when data is read immediately after the data is written, which allows the time required for a retention test to be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory device comprising:
   a memory cell having a first transistor for retaining data at a first potential level and a second transistor for retaining data at a second potential level lower than the first potential level;
   first and second bit lines respectively connected to said first and second transistors;
   a switching element for isolating said first and second bit lines from a power source during a test of said memory cell; and
   a write driver having three modes, namely, a first potential level, a second potential level, and a high impedance state for setting, during data writing in the test of said memory cell, a potential on said second bit line to the second potential level, and said first bit line to a high impedance.

2. The semiconductor memory device according to claim 1 wherein said write driver has a circuit for setting, in order to remove charge accumulated in said first and second bit lines and the memory cell during data writing in the test of said memory cell, said first and second bit lines to the second potential level for a period of time, and thereafter setting said first bit line to a high impedance state.

3. The semiconductor memory device according to claim 2 wherein said circuit is a delay circuit.

4. The semiconductor memory cell testing apparatus according to claim 2 wherein said write driver comprises:
   a first three-input NAND gate receiving at respective inputs a data input signal, a test signal, and an inversion of a write enable signal, a first NOR gate receiving at respective inputs the data input signal and the write enable signal, and a first two-input inverter receiving, at respective inputs, outputs of said first three-input NAND gate and said first NOR gate, said first two-input inverter producing an output connected to said first bit line and producing a high impedance state when said first three-input NAND gate and said first NOR gate produce different level outputs;
   a second three-input NAND gate receiving at respective input terminals an inversion of the data input signal, the test signal, and the inversion of the write enable signal, a second NOR gate receiving at respective input terminals an inversion of the data input signal and the write enable signal, and a second two-input inverter receiving, at respective inputs, outputs of said second three-input NAND gate and said second NOR gate, said second two-input inverter producing an output connected to said second bit line and producing a high impedance state when said second three-input NAND gate and said second NOR gate produce different level outputs;
   an exclusive OR gate receiving the write enable signal at a first input, said delay circuit being connected to a second input of said exclusive OR gate and receiving the write enable signal; and
   a third NOR gate receiving an output of said exclusive OR gate at a first input and the test signal at a second input, wherein the output of said first NOR gate is supplied to said first two-input inverter through a first OR gate, said first OR gate receiving the output of said first NOR gate at a first input and receiving an output of said third NOR gate at a second input, and the output of said second NOR gate is supplied to said second two-input inverter through a second OR gate, said second OR gate receiving the output of said second NOR gate at a first input and receiving an output of said third NOR gate at a second input.

5. The semiconductor memory cell testing apparatus according to claim 1 wherein said write driver comprises:
   a first three-input NAND gate receiving at respective inputs a data input signal, a test signal, and an inversion of a write enable signal, a first NOR gate receiving at respective inputs the data input signal and the write enable signal, and a first two-input inverter receiving, at respective inputs, outputs of said first three-input NAND gate and said first NOR gate, said first two-input inverter producing an output connected to said first bit line and producing a high impedance state when said first three-input NAND gate and said first NOR gate produce different level outputs; and
   a second three-input NAND gate receiving at respective input terminals an inversion of the data input signal, the test signal, and the inversion of the write enable signal, a second NOR gate receiving at respective input terminals an inversion of the data input signal and the write enable signal, and a second two-input inverter receiving, at respective inputs, outputs of said second three-input NAND gate and said second NOR gate, said second two-input inverter producing an output connected to said second bit line and producing a high impedance state when said second three-input NAND gate and said second NOR gate produce different level outputs.

6. A semiconductor memory device comprising:
   a memory cell having a first transistor for retaining data at a first potential level and a second transistor for retaining data at a second potential level lower than the first potential level;
   first and second bit lines respectively connected to said first and second transistors;
   a switching element for isolating said first and second bit lines from a power source during a test of said memory cell;
   a write driver having at least two modes, namely, a first potential level and a second potential level, for setting, during data writing in the test of said memory cell, a potential on said second bit line to the second potential level; and
   a bit select circuit for validating an output of said write driver by setting said second bit line to the second potential level in a test of said memory cell, and invalidating an output of said write driver by setting said first bit line in the high impedance state in the test of said memory cell.

* * * * *